United States Patent
Zait et al.

(10) Patent No.: US 7,736,819 B2
(45) Date of Patent: Jun. 15, 2010

(54) METHOD FOR CORRECTING CRITICAL DIMENSION VARIATIONS IN PHOTOMASKS

(75) Inventors: Eitan Zait, Kibbutz Hanita (IL); Vladimir Dmitriev, Carmiel (IL); Nikolay N. Guletsky, St. Petersburg (RU); Sergey Oshemkov, Carmiel (IL); Guy Ben-Zvi, Kibbutz Ramat Yohanan (IL)

(73) Assignee: Pixer Technology Ltd, Karmiel (IL)

( * ) Notice: Subject to any disclaimer, the term of this patent is extended or adjusted under 35 U.S.C. 154(b) by 732 days.

(21) Appl. No.: 10/564,972

(22) PCT Filed: Jul. 18, 2004
(Under 37 CFR 1.47)

(86) PCT No.: PCT/IL2004/000653
§ 371 (c)(1),
(2), (4) Date: Aug. 1, 2006

(87) PCT Pub. No.: WO2005/008333
PCT Pub. Date: Jan. 27, 2005

(65) Prior Publication Data
US 2007/0065729 A1    Mar. 22, 2007

Related U.S. Application Data

(60) Provisional application No. 60/488,717, filed on Jul. 18, 2003.

(51) Int. Cl.
G03F 1/00    (2006.01)
(52) U.S. Cl. .......................................... 430/5; 430/290
(58) Field of Classification Search .............. 430/5, 430/290, 321, 945
See application file for complete search history.

(56) References Cited

U.S. PATENT DOCUMENTS 6,566,016 B1    5/2003    Ziger (Continued)

FOREIGN PATENT DOCUMENTS

WO    WO 03/071358    8/2003

OTHER PUBLICATIONS

Jong Rak Park et al , "Improvement of Shot Uniformity on a Wafer by Controlling Backside Transmittance Distribution of a Photomask", Optical Microlithography, Proceedings of SPIE, vol. 5040. 2003, pp. 553-560.

(Continued)

Primary Examiner—Mark F Huff
Assistant Examiner—Stewart A Fraser
(74) Attorney, Agent, or Firm—Pearl Cohen Zedek Latzer, LLP

(57) ABSTRACT

A method for compensating for critical dimension (CD) variations of pattern lines of a wafer, by the correcting the CD of the corresponding photomask. The photomask comprises a transparent substrate having two substantially opposite surfaces, a first back surface and a second front surface on which front surface an absorbing coating is provided, on which the pattern lines were formed by removing the coating at the pattern lines. The method comprises: determining CD variations across regions of a wafer exposure field relating to the photomask; and providing Shading Elements (SE) within the substrate of the photomask in regions which correlates to regions of the wafer exposure field where CD variations greater than a predetermined target value were determined, whereby the shading elements attenuate light passing through the regions, so as to compensate for the CD variations on the wafer and hence provide and improved CD tolerance wafer.

12 Claims, 3 Drawing Sheets

U.S. PATENT DOCUMENTS

2002/0076655 A1* 6/2002 Borrelli et al. ............. 430/321
2002/0086245 A1* 7/2002 Zait et al. .................. 430/321
2003/0157415 A1* 8/2003 Ziger ........................... 430/5
2004/0067422 A1 4/2004 Park et al.
2005/0084767 A1* 4/2005 Zait et al. ...................... 430/5

OTHER PUBLICATIONS

Alfred Kwok-Kit Wong. "Resolution Enhancement Techniques in Optical Lithography", SPIE Press 2001, Chapter 1 3 4. pp. 18-23.

* cited by examiner

METHOD FOR CORRECTING CRITICAL DIMENSION VARIATIONS IN PHOTOMASKS

CROSS-REFERENCE TO RELATED APPLICATIONS

This application is a National Phase Application of PCT International Application No. PCT/IL2004/000653, International Filing Date Jul. 18, 2004, claiming priority of US Provisional Patent Application, 60/488,717, filed Jul. 18, 2003.

FIELD OF THE INVENTION

The present invention relates to photo-masks. More particularly it relates to a method for treating a photomask to correct critical dimensions (CD) variations in wafers manufactured using that photomask, by way of providing shading elements and or diffractive optical elements for radiation attenuation incorporated in a photo-mask.

BACKGROUND OF THE INVENTION

Photo-masks used in the manufacturing of integrated circuits (IC) are composed of a Chrome layer deposited on Quartz or fused Silica plates, which are subsequently patterned for use as a "negative", similarly to the printing process in photography, in a photolithographic process.

In a photolithographic process, UV (ultraviolet) light passes through the pattern inscribed on the Chrome layer, and an image is formed within the photo-resist layer on top of a Silicone wafer.

Additional layers, like protective layers, antireflective layers, or an embedded phase-shifting layer, such as MoSi, occasionally accompany the chrome layer.

Additional applications similar to IC are the lithographic processes for thin film magnetic read/write heads used in hard disk drives for data storage.

Front-end IC processes require sub-micron resolution, typically with an optical demagnification factor of 1:4 from a mask object to the printed image on Silicone wafers.

Such sub-micron processes require that critical dimensions (CD) of the features printed on the wafer, be uniform, with strict specifications.

However, it is well known throughout the semiconductor industry, that the lithography process suffers from CD variations, which often exceed specifications and requirements.

Not all CD variations are inherent to the homogeneity of the patterning on the photomask itself. In fact, a large proportion of CD variations may be attributed to external causes, such as the optical set-up used in the photolythographic process. There are various sources for CD variations, some of which are lenses aberrations, masks non-uniform patterning, illumination design, Photo-resist coating and development, etching processes and others.

Thorough studies of CD variations (Improvement of Shot uniformity on a wafer by controlling backside transmittance distribution of a photomask, Jong Rak Park, Soon Ho Kim, Gi-Sung Yeo, Sung-Woon Choi, Won-Tai Ki, Hee-Sun Yoon, Jung-Min Sohn, Samsung electronics co. LTD, SPIE proceedings, February 2003 (5040-45)) have shown that variations are in most cases, segmented to specific areas of the exposure field. An exposure field is equivalent to one projection of the mask on the wafer, hence a single wafer contains many exposure fields of the same mask. A good statistical model can specify numbers of percent of CD deviations for each area.

CD variations may be improved by taking an advantage of the fact that photo-resist threshold for activation, varies linearly with the logarithm of the exposure dose, with a slope constant—γ ("Resolution enhancement techniques in optical lithography" (chapter 1.3.4), Alfred Kwok-Kit Wong (SPIE PRESS 2001)).

If variations are a few percent above a specified value, a reduction of the UV radiation dose, will change the CD value, such as the printed line width (or contact-holes diameter) and will bring it closer to the required value.

One possible way of applying a dose reduction pattern to a photomask, on its back-side, is by patterning grooves or holes on the back-side surface of the mask (see US 20040067422, to Park et al.).

However, such a method is limited in its dynamic range, the process is slow, and suffers from high equipment cost.

There are other methods for CD control, which are commonly used in the semiconductors industry (like the focus/exposure (dose) process-window optimization, which determines the average CD on wafers) but are generally not suitable for controlling CD variations within and across the exposure fields on the wafer (Intra field CD variations).

It is an object of the present invention to provide a way that greatly reduces intra field CD variations associated with a photomask in the photolithographic process.

Yet another object of the present invention is to provide such a way for reducing CD variations that employs shading elements or diffractive optical elements embedded in the photomask.

BRIEF DESCRIPTION OF THE INVENTION

There is thus provided, in accordance with some preferred embodiments of the present invention, a method for compensating for critical dimension (CD) variations of pattern lines of a wafer, by the correcting the CD of the corresponding photomask, the photomask comprising a transparent substrate having two substantially opposite surfaces, a first back surface and a second front surface on which front surface an absorbing coating is provided, on which the pattern lines were formed by removing the coating at the pattern lines, the method comprising:

determining CD variations across regions of a wafer exposure field relating to the photomask; and providing Shading Elements (SE) within the substrate of the photomask in regions which correlates to regions of the wafer exposure field where CD variations greater than a predetermined target value were determined, whereby the shading elements attenuate light passing through the regions, so as to compensate for the CD variations.

Furthermore, in accordance with some preferred embodiments of the present invention, the providing of shading elements comprises employing pulsed laser.

Furthermore, in accordance with some preferred embodiments of the present invention, the pulsed laser comprises ultra-short femtosecond pulsed laser.

Furthermore, in accordance with some preferred embodiments of the present invention, the provision of shading elements is carried out by irradiating pulsed laser radiation through the back surface into the photomask and substantially opposite pattern lines.

Furthermore, in accordance with some preferred embodiments of the present invention, at least some of the shading elements comprise Diffractive Optical elements (DOEs).

Furthermore, in accordance with some preferred embodiments of the present invention, the shading elements are inscribed within the substrate by directing laser energy through the back surface.

Furthermore, in accordance with some preferred embodiments of the present invention, parameters for the shading elements is determined using a reference calibration list of parameters for shading elements and their relative attenuation power.

Furthermore, in accordance with some preferred embodiments of the present invention, the shading elements are designed to cause attenuation of up to about 15%.

Furthermore, in accordance with some preferred embodiments of the present invention, the pulsed ultra-short femto-second laser is operating at a fast repetition rate of more then one KHz, preferably at above 10 KHz.

Furthermore, in accordance with some preferred embodiments of the present invention, the method further comprises using a computer program to calculate information on location, size and design parameters of the shading elements and use the information to operate a pulsed laser source to inscribe the shading elements within the photomask.

Furthermore, in accordance with some preferred embodiments of the present invention, the computer program uses a reference calibration list to determine the parameters of the shading elements.

BRIEF DESCRIPTION OF THE DRAWINGS

In order to better understand the present invention, and appreciate its practical applications, the following Figures are provided and referenced hereafter. It should be noted that the Figures are given as examples only and in no way limit the scope of the invention. Like components are denoted by like reference numerals.

DETAILED DESCRIPTION OF PREFERRED EMBODIMENTS

Figure 1:
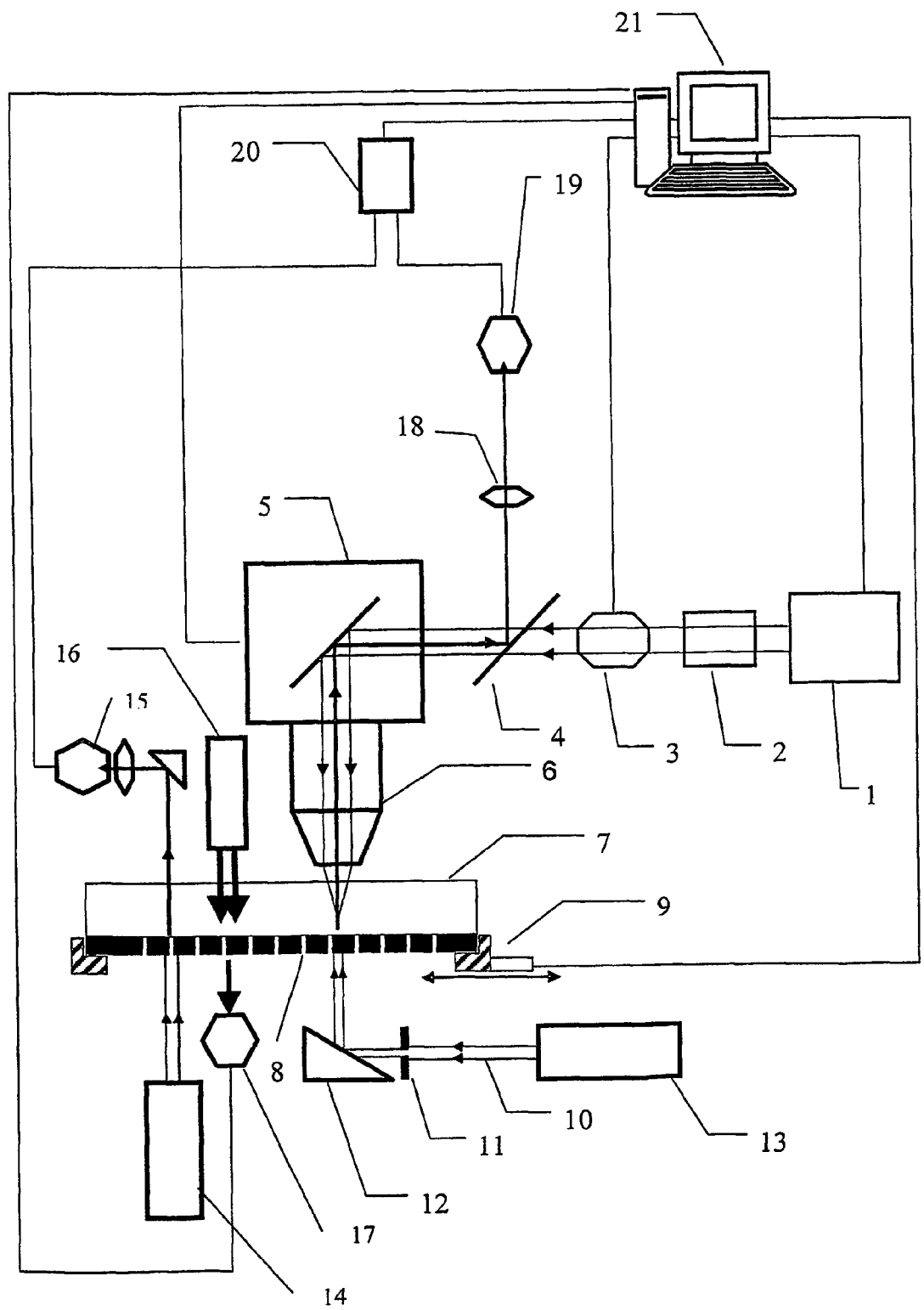
FIG. 1 illustrates a proposed setup of a laser mask processing station, in accordance with a preferred embodiment of the present invention. The mask is placed on a holder on an XYZ stage.

Process variations in lithographic printing of integrated circuits is characterized by variations in the sizes of lines and spaces printed on Silicon wafers.

Variations of lines and spaces are measured as average CD (critical dimension) size at different areas on the wafers. If variations in the width of lines and spaces imprinted on a wafer occur, than the photomask is said to have CD variations.

The present invention provides a novel method for controlling CD variations on the exposure field of a wafer by writing shading elements made of pixels inside the glass substrate of a photomask with an ultrafast femto second laser. The shading element attenuation level is determined by controlling pixel size and pixel 3 dimensional arrangement in the volume of the substrate.

The required attenuation level is determined by the degree of CD variation from the target CD within the exposure filed of the wafer.

Attenuating the light passing through a photomask (in areas where CD is above a target value) results, in the photolithographic process, in reduction of the CD in these areas, and therefore results in a reduction of CD variations over the exposed field.

An ultra-short pulsed laser, with typical pulse duration on the order of 100 femto-seconds, is focused preferably through the back side of photomasks into the substrate, to create at predetermined focal points break-down points where energy exceeds threshold for non-linear absorption inside transparent media, thereby creating local changes in the index of refraction.

This breakdown inside a transparent medium, such as glass or Quartz material, results in pixel points which scatter light due to different density and index of refraction.

At fast laser repetition rate at above 50 KHz, combined with a fast scanning optics and a moving X,Y stage, arrays of pixels inside the glass substrate provide shading elements with predetermined pixel size, predetermined lateral size, density of pixels, number of layers and the resulting shading level, aimed at compensating for the CD variations.

Description of a typical CD correction process in accordance with a preferred embodiment of the present invention is given herein:

First a test wafer is printed. The test wafer CD distribution is mapped using CD SEM or other optical CD metrology tools. A typical CD distribution map may consist of tens or hundreds of CD measurement points. The measurement points and their respective CD variation values are gathered in a simple table by conventional CD mapping techniques in such a way that each CD point is assigned a set of X and Y coordinates and a CD variation value in percent. The final table represents one exposure field and is equivalent to the area of the mask which was used to print the wafer.

It is noted that the wafer exposure field CD variation map represents the superposition of all CD variation sources including but not limited to CD variations in the mask itself.

After loading the CD variation table to a CD correction tool in accordance with the present invention, a computer program is used to translate the CD variation values in percentage to the required attenuation levels in percentage. Next, the program translates the required attenuation level to a set of pixels arranged in 3 dimensions of the mask volume so as to provide an attenuation map which is in essence a negative of the CD variation (Hence areas with largest CD variation will receive the most dense pixel CD correction pattern and will result in lowest UV transmittance).

Once the mask is loaded to the CDC (CD Correction) tool and aligned, the ultrafast laser is used to inscribe a pattern of pixels based on said desired CDC map.

After completion of the laser writing step a UV transmission measurement system measures the level of attenuation on each area of the mask and compares it to the desired attenuation level. If more attenuation is required the specific area may be reprocessed by the CDC tool to increase the attenuation level.

After completing laser writing and UV transmission measurements the mask is returned for wafer printing and the resulting print provides reduced (improved) CD variation within and across the exposure field.

Typically, a fast pulsed femtosecond laser, with a repetition rate of about 200 KHz, capable of delivering short laser pulses of about 150 fs, but below 20 pico-seconds duration, at energies greater then five nano-joule per pulse, can create a local change in the index of refraction of the mask substrate, and/or the formation of break-down zones, with a high enough level of scattering and absorption, to enable a proper design of a shading element (SE) and/or a diffractive optical element (DOE) which is a specific type of a SE SE structure design needs to cast a shadow over a selected area, where average CD variation is specified.

The parameters of the shading elements may be determined using a reference calibration list that comprises a list of various shading element parameters and their corresponding attenuating power (typically measured in percentage).

The range of optically affected area on the front Chrome patterned side of the photomask, is directly proportional to depth in glass above Chrome. Since the mask thickness is typically 6.35 mm, laser pixels patterns below the back side surface, efficiently shade the required areas. If the process requires smaller affected areas, patterns can be inscribed closer to the Chrome coated side, with aberration corrections if needed.

A CD variation map is typically determined using a CD SEM (scanning electron microscope), or an Optical CD system, which measures the CD map across the wafer. The map is typically given as a set of XY coordinates and a plus or minus CD variation value in Nanometers. The method described in this invention, proceeds by determining and executing a set of pixels that will compensate the CD variation when inscribed in the photomask. Compensation is achieved by pixels arrays, which create partial shading, and reduce the dose of UV radiation through the shaded areas of the mask.

One immediate advantage of this novel technique, comes as the result of the ability to pattern pixels inside the transparent media or intra-volume patterning, as it was, for example, demonstrated in WO 03/071358, METHOD AND SYSTEM FOR REPAIRING DEFECTED PHOTOMASKS, By Zait et al.

Laser pixels can be accumulated laterally and/or vertically in order to achieve higher optical densities, to attenuate transmission of U.V. light to the required level with respect to the resist threshold.

When an ultra-short pulsed laser is used to pattern pixels inside glass, or any transparent media, the glass substrate thickness becomes an actual part of the optical system, and intervenes strongly with ray-tracing of the laser beam.

It is well known to experienced optical engineers that adding flat glasses within the optical path-length, introduces a strong spherical aberration, which results in deteriorated resolution by a factor of more then two for a thick glass typically of a quarter of an inch.

Spherical aberration created by a change of the optical path-length of few millimeters in glass is both lateral and longitudinal.

Spherical aberration is responsible for the loss of the ideal shape of the Airy disk of the laser spot at best focus, both laterally and longitudinally.

Most of the laser energy is diverted from the central Airy disk to the outer rings, so laser spot requires many times more energy for optical breakdown, and spot size is enlarged and smeared significantly.

The present invention suggests using back-side patterning of the substrate (i.e. directing laser writing radiation via the back side of the substrate—not through the front side which is already patterned on the Chrome coating), with an optional compensating optical path-length for the additional glass thickness, and so laser patterning is diffraction limited at the required focal plane.

Using an optically compensating setup, spherical aberration can be reduced to such low levels, that Strehl ratios exceed 0.98 (Ratio in energy of aberrated spot to the ideal diffraction limited spot).

In addition, the optical design of shading elements (SE) can be designed according to the numerical aperture (N.A.), aperture type and partial coherence $\sigma$ (Sigma) of the U.V. radiation source.

Calculations of the above parameters for the design of shading elements are fairly complex mathematically, even for the lower diffraction orders, However, for relatively low shading levels of 1%-25%, it is a good approximation to take into account only the Zero-order of diffraction (As in a diffraction grating—the higher orders such as the $\pm 1$ have very small contribution), where attenuation level is determined by the relative area covered by pixels within the arrays.

The attenuation level in most practical cases is in the range of 1% to 25% (the present invention is not limited to that range only), and this process has a very wide dynamic range within that small attenuation range, since the distance between pixels and the laser energy, which determines pixel-size, are controlled to a high accuracy.

At laser pulses repetition rate of more then 50 KHz, combined with a fast scanner and an X,Y moving stage, one shading element made of more then 10 millions pixels, may take a several minutes or less to inscribe.

Shaded areas are determined by a CD measured map. Practically that map may be loaded as a graphical file or a numerical table into a computer, and each area is patterned according to its variation level from a specified reference level taken from the reference list mentioned hereinabove.

Therefore, this invention enables a fast and simple process of CD control improvement on photo-masks within the lithographic process, for all front-end applications.

Reference is now made to FIG. 1, illustrating a proposed setup of a laser mask processing station, in accordance with a preferred embodiment of the present invention. The mask is placed on a holder on an XYZ stage. The system comprises an ultra-short pulsed femtosecond laser 1, where a central computerized control unit 21 controls pulses timing.

Laser pulse fundamental frequency is possibly multiplied to higher harmonics by a harmonics generator 2, followed by a variable attenuator 3, which controls output energy.

Attenuated laser beam is directed into a beam delivery system which may include a scanner, such as a galvo-scanner or a piezo-electric actuator type scanner or an acousto-optic deflector 5, which is synchronized with laser pulses timing and with a 3-axis moving stage 9, by the central computerized control unit 21.

Subsequently the beam is focused by main objective lens 6 into the photo mask glass substrate side 7.

The same objective lens 6 is used for an in-situ machine vision system, which acts as a microscope with high magnification. This microscope can be used for measuring pixel size and shape as well as monitoring of the laser breakdown process inside the glass material. It is also used for accurately positioning the shading elements relative to the desired CD fields in the mask The mask is illuminated by a light source 13 via a light guide 10, and a variable aperture stop 11.

Pixels areas, shape and position are chosen to match the numerical aperture and illumination mode of the lithographic process, for which eventually the photomask is used.

Light is collimated via a condenser lens onto the patterned chrome layer of the mask 8.

An image is eventually formed via objective 6, beam-splitter 4, and a tube-lens 18, which directs the light to CCD camera 19.

Image is grabbed by a continuous frame-grabber 20, and processed at central computerized control unit 21.

A UV source 16 and detection system 17 measures and reads the UV radiation attenuation level of each shading area patterned inside the glass.

An additional imaging system 15 (using light source 14) with low magnification, is used for navigation across the mask and to determine coordinates of alignment marks, so CD variation tables which contain XY alignment coordinates may be loaded to the computer, and match the laser patterning process.

Figure 2:
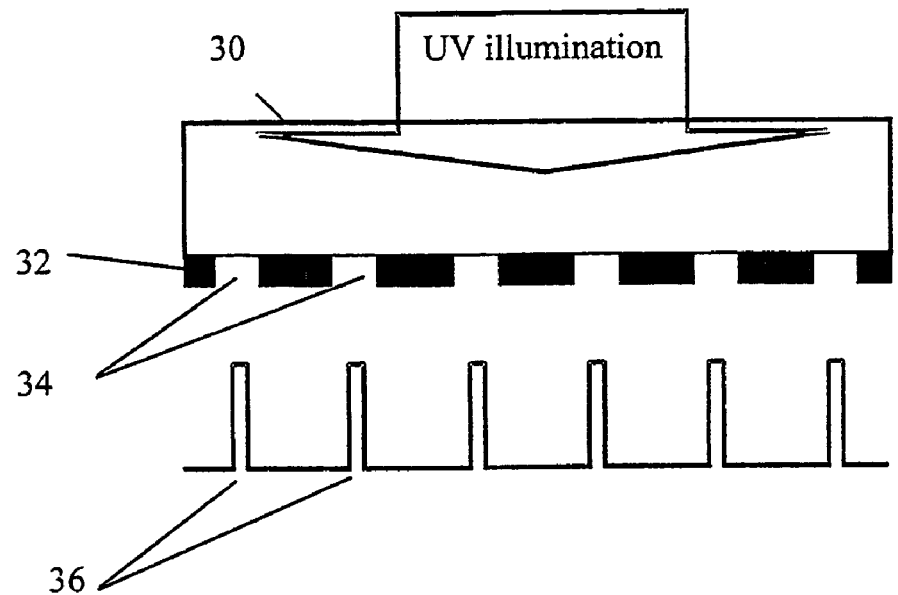
FIG. 2 illustrates an ideal situation where the illumination, photomask and imaging parameters are ideal and the CD on the Silicon wafer itself is ideally uniform.

FIG. 2 describes an ideal situation where the illumination, mask and imaging parameters are ideal and the CD on the wafer level is ideally uniform. The photomask 30 is includes absorbing coating 32, on which a predetermined pattern 34 is provided in the form of clear lines (the coating is removed there). The lines are ideally uniform in thickness, and no external effect is causing CD variations, as is seen by plot 36.

Figure 3:
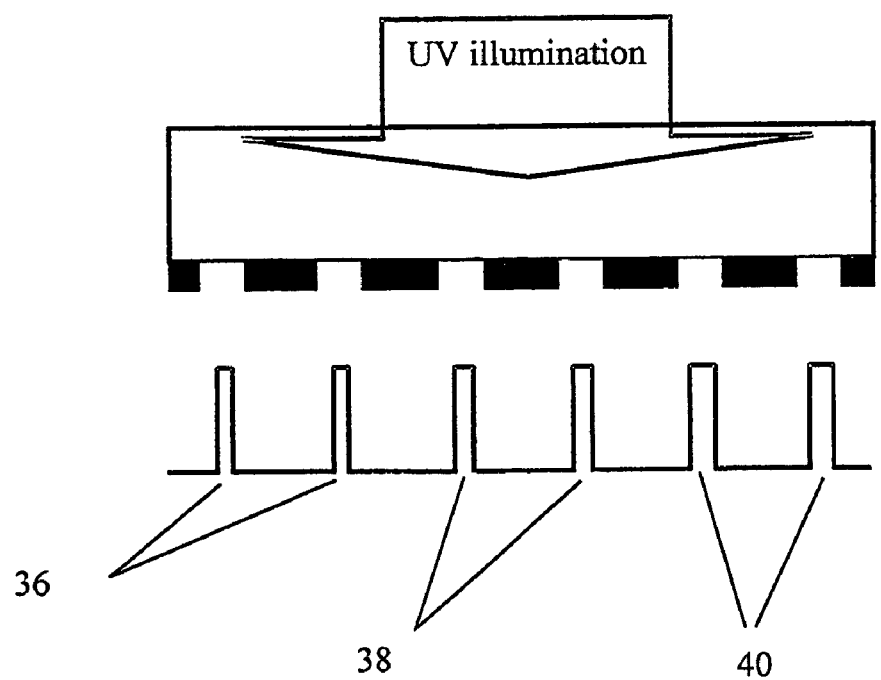
FIG. 3 illustrates an actual situation where CD varies across the exposure field on the wafer due to one or more reasons (such as illumination beam inhomogeneity, mask CD variation, imaging optics aberrations).

FIG. 3 describes an actual situation where the CD varies across the wafer exposure field due to variations in one or a few reasons (such as illumination beam inhomogeneity, mask CD variation, imaging optics aberrations). In the left-hand side the lines display ideal CD uniformity 36, in the middle there is a region of small CD variations 38, whereas on the right-hand side there is a region of large CD variations 40.

Figure 4:
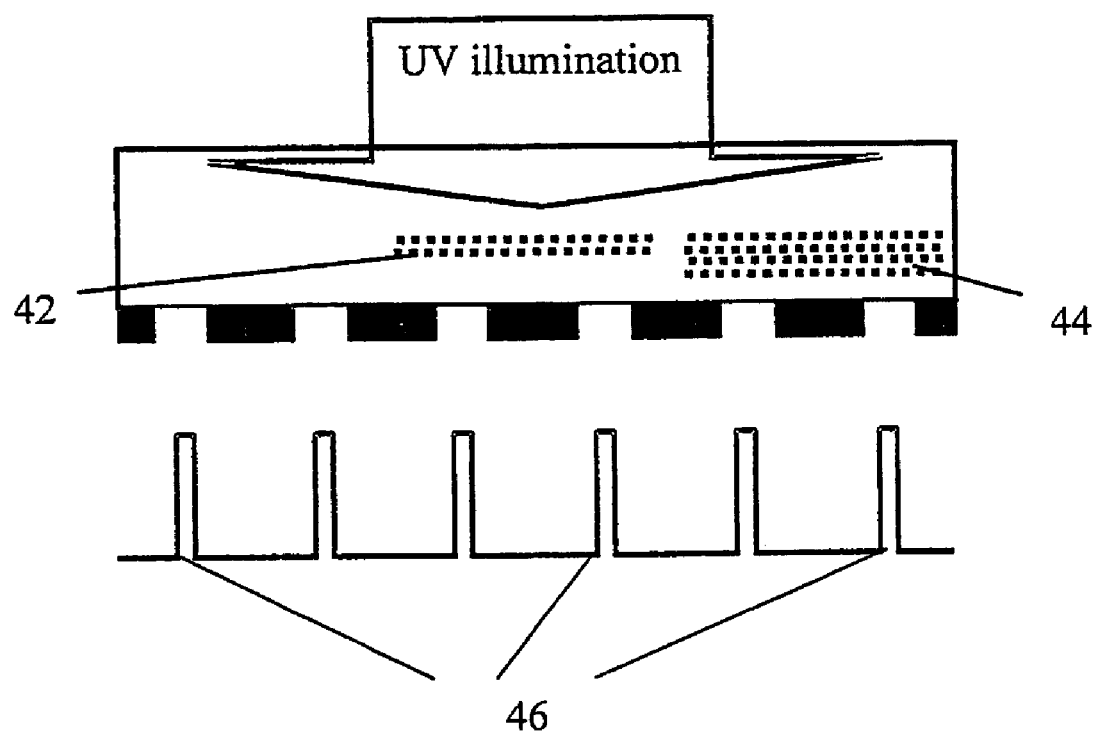
FIG. 4 illustrates a corrected situation where based on actual CD variation information of the wafer, a compensating pattern is generated inside the photomask, which attenuates the level of UV light transmitted through each region of lines on the mask and hence corrects the effective CD value on the wafer to the desired value.

FIG. 4 describes a corrected situation where based on actual CD variation maps (for instance from a CD SEM) of the wafer (same one of FIG. 3) a compensating pattern is generated inside the photomask which attenuates the level of UV light transmitted through each region of lines on the mask and hence corrects the effective CD value on the wafer exposure field to the desired value. In the central region a weak CD correction pattern 42 is provided, inscribed within the photomask, whereas in the right-hand side a stronger CD correction pattern 44 is provided—of higher attenuation strength, resulting in a corrected projected pattern 46.

The CD correction pattern is preferably created by writing through the substrate from its back surface (i.e. opposite the chrome layer) into a pre-adjusted best focal plane within the substrate. This is mainly because the front side is coated with a Chrome layer and patterned, so CD variations correction is easily done writing through the back-side which is transparent and free for adding the shading patterns.

It should be clear that the description of the embodiments and attached Figures set forth in this specification serves only for a better understanding of the invention, without limiting its scope.

It should also be clear that a person skilled in the art, after reading the present specification could make adjustments or amendments to the attached Figures and above described embodiments that would still be covered by the scope of the present invention.

The invention claimed is:

1. A method for compensating for critical dimension (CD) variations of pattern lines of a wafer, by correcting the CD of a corresponding photomask used in manufacturing the pattern lines on the wafer, the photomask comprising a transparent substrate having two substantially opposite surfaces, a first back surface and a second front surface on which front surface an absorbing coating is provided, on which the pattern lines were formed by removing the coating at the pattern lines, the method comprising:

mapping CD variations across regions of a wafer exposure field relating to the photomask; and using laser radiation providing Shading Elements within the substrate of the photomask in regions which correlate to regions of the wafer exposure field where CD variations greater than a predetermined target value were determined, the shading elements forming correction patterns across the correlating regions wherein the shading elements include arrays of pixels, each array extending across one of the regions;

thereby having the shading elements attenuate light passing through the regions, so as to compensate for the CD variations.

2. The method of claim 1, wherein the step of providing shading elements comprises employing pulsed laser.

3. The method of claim 2, wherein the pulsed laser comprises ultra-short femtosecond pulsed laser.

4. The method of claim 1, wherein the step of providing shading elements is carried out by irradiating pulsed laser radiation through the back surface into the photomask and substantially opposite pattern lines.

5. The method of claim 1, wherein the at least some of the shading elements comprise Diffractive Optical elements.

6. The method of claim 1, wherein the shading elements are inscribed within the substrate by directing laser energy through the back surface.

7. The method of claim 1, wherein parameters for the shading elements are determined using a reference calibration list of parameters for shading elements and their relative attenuation power.

8. The method of claim 1, wherein the shading elements are designed to cause attenuation of up to about 15%.

9. The method of claim 3, wherein the ultra-short femtosecond pulsed laser is operable at a fast repetition rate of more then one KHz, preferably at above 10 KHz.

10. The method of claim 1, further comprising using a computer program to calculate information on location, size and design parameters of the shading elements and use the information to operate a pulsed laser source to inscribe the shading elements within the photomask.

11. The method of claim 10, wherein the computer program uses a reference calibration list to determine the parameters of the shading elements.

12. The method of claim 3, wherein the ultra-short femtosecond pulsed laser is operable at a fast repetition rate of more than 10 KHz.

* * * * *